United States Patent [19]

Waldo

[11] Patent Number: 5,503,958
[45] Date of Patent: Apr. 2, 1996

[54] METHOD FOR FORMING A CIRCUIT PATTERN

[75] Inventor: Whit G. Waldo, Hutto, Tex.

[73] Assignee: Motorola Inc., Schaumburg, Ill.

[21] Appl. No.: 250,228

[22] Filed: May 27, 1994

[51] Int. Cl.⁶ ........................................................... G03F 7/20
[52] U.S. Cl. .................... 430/311; 430/966; 430/967; 378/34; 378/156; 378/157; 378/161
[58] Field of Search .................................... 430/311, 313, 430/966, 967; 378/156, 157, 161, 34, 35

[56] References Cited

U.S. PATENT DOCUMENTS 4,528,685  7/1985  Kump ........................................ 378/157
5,142,561  8/1992  Doumas ..................................... 378/84

OTHER PUBLICATIONS

Scott D. Hector et al., "Simultaneous optimization of spectrum, spatial coherence, gap, feature bias, and absorber thickness in synchrotron-based proximity x-ray lithography", Nov./Dec. 1993, Journal of Vacuum Science and Technology B, 11 (6), pp. 2981–2985.

Microlithography Process Technology for IC Fabrication, by David J. Elliot, published by McGraw–Hill Book Company, 1986, pp. 193–211.

*Primary Examiner*—Kathleen Duda
*Attorney, Agent, or Firm*—Kent J. Cooper

[57] ABSTRACT

In one embodiment of the invention x-rays pass through an aluminum filter (18) to form filtered x-rays. At least a portion of the filtered x-rays then pass through a portion of a x-ray mask (22) to expose a portion of a photoresist layer overlying a semiconductor substrate. The aluminum filter removes high energy photons from the x-ray spectrum that adversely effect the lithographic patterning process.

15 Claims, 5 Drawing Sheets

METHOD FOR FORMING A CIRCUIT PATTERN

FIELD OF THE INVENTION

This invention relates generally to semiconductor devices, and more generally to a process for forming a circuit pattern on a semiconductor substrate.

BACKGROUND OF THE INVENTION

The semiconductor industry's continuing drive toward advanced integrated circuits with increased performance and higher device packing densities has required an accompanying decrease in the minimum feature size of devices. Therefore, each new generation of advanced integrated circuit has required an increase in lithographic resolution. Traditionally, optical lithography has been used to define integrated circuit patterns on semiconductor substrates. However, current optical lithography systems have great difficulty defining photoresist patterns with feature sizes of less than 0.35 microns, which are required for next generation devices.

X-ray lithography has been proposed for fabricating next generation integrated circuits because it has a relatively large process latitude, as compared to optical lithography. The ultra-short wavelengths of the x-rays eliminate the diffraction effects that limit the resolution of optical lithography systems, and thus higher resolution can be achieved with x-ray lithography. X-ray lithography also affords a greater depth of focus over optical lithography. In addition, x-rays are relatively penetrating and therefore particles on a x-ray mask or on a photoresist layer are transparent and thus they do not contribute to defect formation during the integrated circuit fabrication process.

Existing x-ray lithography systems, however, use lithographic exposure spectrums with photon energy distributions ranging from about 800 electron volts (eV) to about 2000 eV, and this exposure spectrum adversely effects the formation of photoresist circuit patterns having small feature sizes. Therefore, the formation of advanced integrated circuits with x-ray lithography is limited. Accordingly, a need exists for an improved x-ray lithography process.

SUMMARY OF THE INVENTION

The previously mentioned problems with existing x-ray lithography processes are overcome by the present invention. In one form of the invention, a circuit pattern is formed by providing a semiconductor substrate. The semiconductor substrate is then coated with a photoresist layer to form a photoresist coated semiconductor substrate. A x-ray mask is provided and the photoresist coated semiconductor substrate is placed in close proximity to the x-ray mask. An actinic filter is provided that has an absorption edge energy of greater than 800 electron volts. X-rays are provided that have a first photon energy distribution, and first photon energy distribution having a first intensity value at the absorption edge energy of the actinic filter. A portion of the x-rays are passed through the actinic filter to form actinic filtered x-rays. The actinic filtered x-rays having a second photon energy distribution and the second photon energy distribution having a second intensity value at the absorption edge energy of the actinic filter, wherein the second intensity value is less than half of the first intensity value. At least a portion of the filtered x-rays are passed through a portion of the x-ray mask to expose a portion of the photoresist layer. The photoresist layer is then developed to form the circuit pattern.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
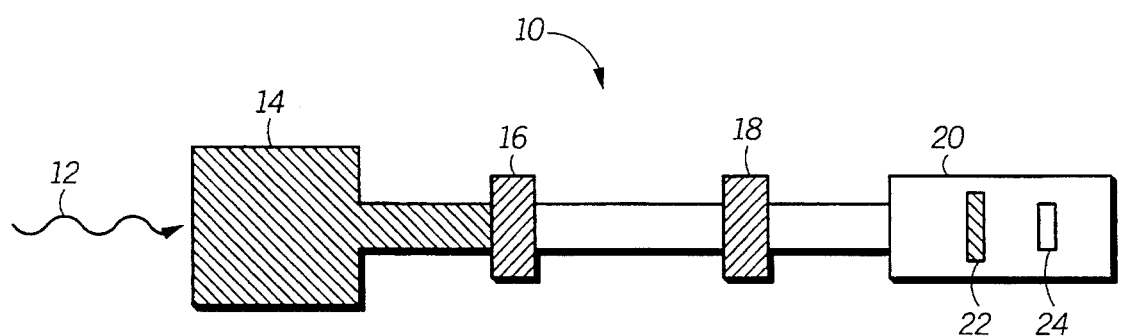
FIG. 1 illustrates, in cross-section, a x-ray lithography system in accordance with one embodiment of the invention.

FIG. 1 illustrates a x-ray lithography system in accordance with one embodiment of the invention. Shown in FIG. 1 is a x-ray lithography system 10 comprising a x-ray source 12, a beam line 14, a beryllium window 16, an actinic filter 18 and an exposure chamber 20. In addition, FIG. 1 also shows a x-ray mask 22 and a photoresist coated semiconductor substrate 24 that have been placed within x-ray lithography system 10. X-ray source 12 is a conventional x-ray source such as a synchrotron x-ray source or a point x-ray source (e.g., an electron impact x-ray source). Beam line 14 is a conventional beam line and is used to guide or direct x-rays generated by x-ray source 12 toward exposure chamber 20. Beryllium window 16 is also conventional and it protects the vacuum integrity of beam line 14 while also serving as a beam line exit window for x-rays. Exposure chamber 20 is also conventional and it is used to position photoresist coated semiconductor substrate 24 in close proximity to x-ray mask 22. Actinic filter 18 may be placed either upstream of beryllium window 16 within beam line 14, or as shown in FIG. 1, it may be placed downstream of beryllium window 16, such that it is interposed between beryllium window 16 and x-ray mask 22. Actinic filter 18 is positioned orthogonally to the incident x-rays (i.e., the x-rays are normal to the actinic filter 18), as shown in FIG. 1.

Figure 2:
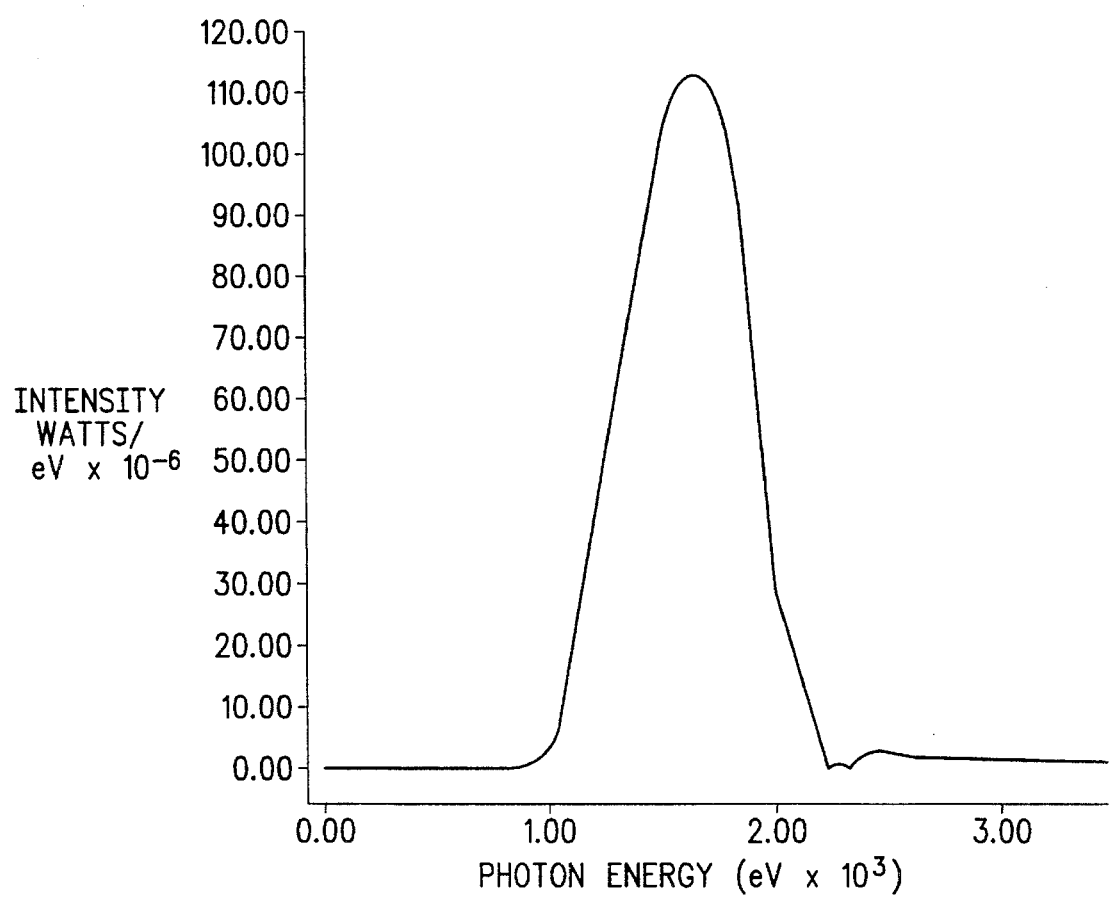
FIG. 2 illustrates a photon energy distribution for a conventional x-ray exposure spectrum.
Figure 3:
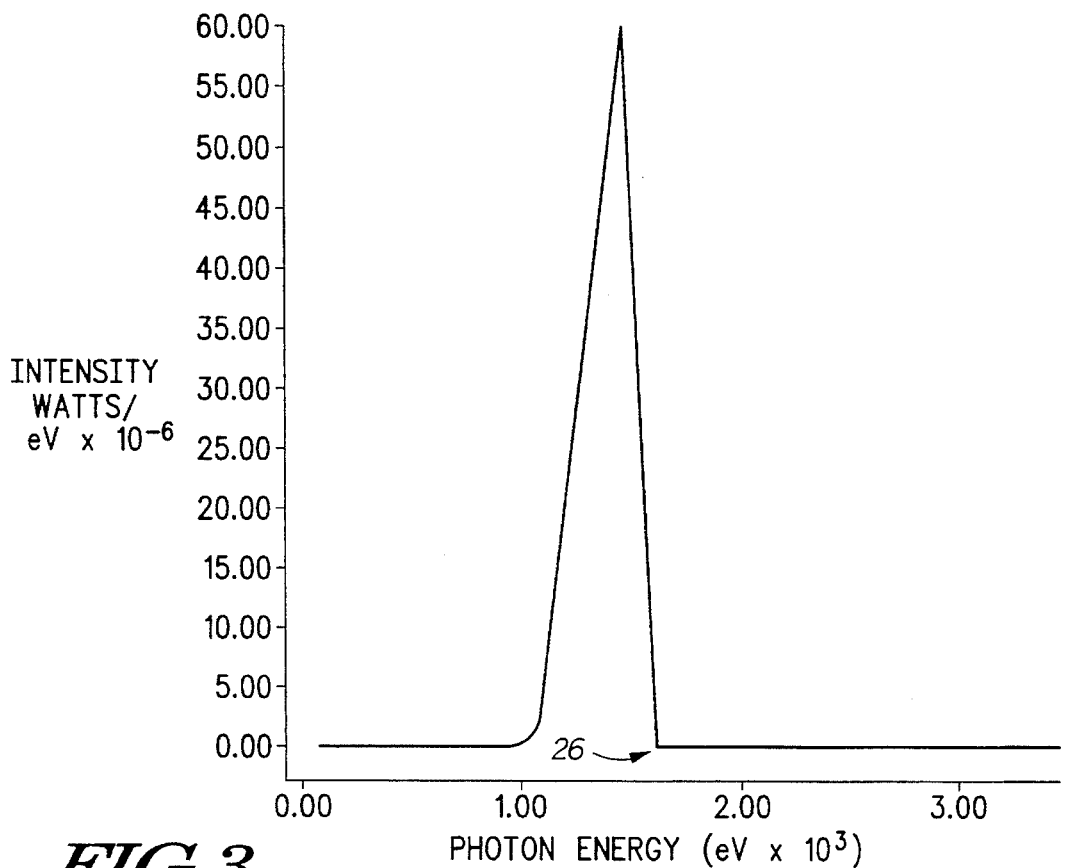
FIG. 3 illustrates a photon energy distribution for a x-ray exposure spectrum in accordance with one embodiment of the invention.

Actinic filter 18 transmits x-rays according to its absorption characteristics and thus it tailors the bandwidth of the lithographic exposure spectrum. The absorption of photons by actinic filter 18 depends on the material used for actinic filter 18 and on its thickness. The conventional x-ray exposure spectrum downstream of the grazing incidence reflective mirror within beam line 14 has photon energies ranging from about 800 electron volts (eV) to about 2000 eV. This photon energy distribution is shown in FIG. 2. Actinic filter 18 is formed with a material that has an absorption edge energy (i.e., for the k, 1s atomic energy shells) of greater than 800 eV and preferably it is formed with a material that has an absorption edge energy that lies within a range of from about 1000 eV to about 2000 eV. For example, actinic filter 18 may be silicon (Si) which has an absorption edge energy of 1839 eV, aluminum (Al) which has an absorption edge energy of 1559 eV, or magnesium (Mg) which has an absorption edge energy of 1303 eV. Alternatively, actinic filter 18 may also be a composite material comprising one of these elements, such as silicon carbide, silicon nitride, aluminum nitride, silicon dioxide, aluminum oxide, magnesium oxide, et cetera, or a composite of these elements such as aluminum-silicon, aluminum-magnesium, or the like. In addition, the thickness of actinic filter 18 is also selected such that the photon energy distribution of x-rays passing through it has a photon intensity value at the absorption edge energy, which is reduced by at least half, as compared to the corresponding photon intensity, at that energy, for the photon energy distribution of the x-rays before they pass through actinic filter 18. Actinic filter 18 preferably has a thickness ranging from about 500 nanometers (nm) to about 10 microns. For example, a 6.5 micron thick actinic filter consisting essentially of aluminum may be used to reduce the photon intensity at its absorption edge energy of 1559 eV to near zero as shown in FIG. 3. Note, that in FIG. 3 the absorption energy edge for aluminum is denoted with the numeral 26. This is in comparison to FIG. 2, where prior to passing through actinic filter 18 the x-rays have a photon intensity value of approximately 115 at 1559 eV. As shown by this comparison actinic filter 18 allows lower energy photons to be transmitted through it, while at the same time it inhibits or blocks the transmission of higher energy photons that have energies greater than or equal to the absorption edge energy of the filter. Thus actinic filter 18 changes the x-ray exposure spectrum so that it is narrower and of lower intensity and composed principally of lower energy photons.

Figure 4:
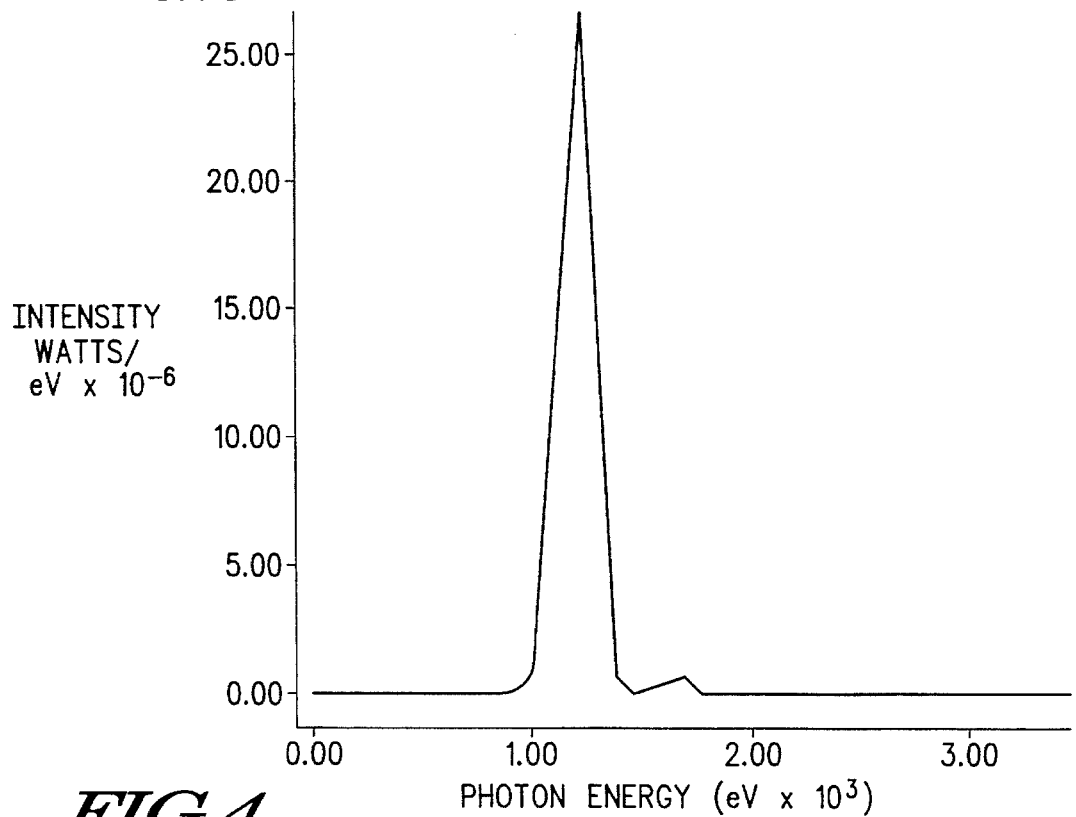
FIG. 4 illustrates a photon energy distribution for a x-ray exposure spectrum in accordance with another embodiment of the invention.

In addition, a combination of actinic filters may also be used to modify or filter the x-ray exposure spectrum. For example, a 5.0 micron thick actinic filter consisting essentially of magnesium may be used in conjunction with a 1.5 micron thick actinic filter consisting essentially of aluminum to produce the photon energy distribution shown in FIG. 4. Again, the filters may be placed either before or after beryllium window 16, or one filter could be placed upstream of beryllium window 16 and the other could be interposed between the beryllium window 16 and x-ray mask 22.

Figure 5:
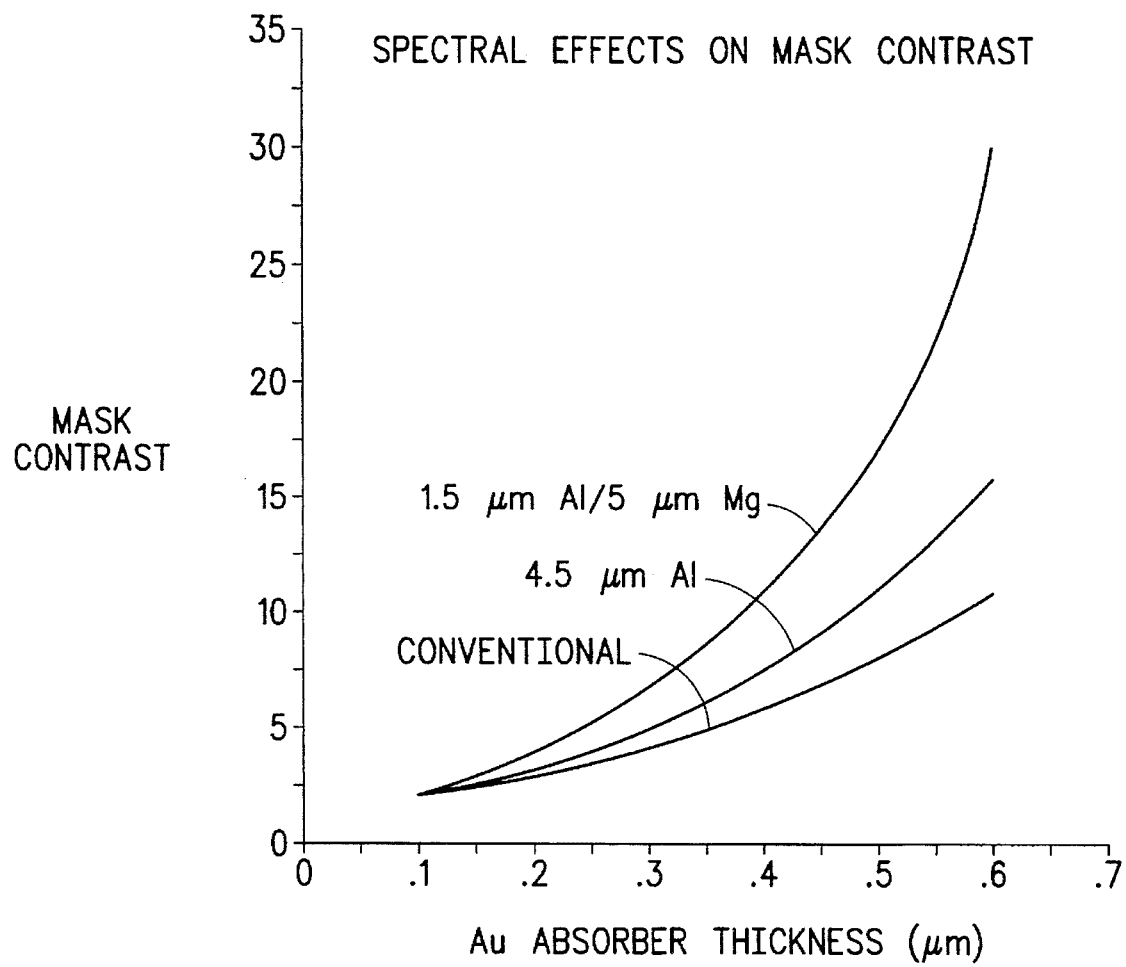
FIG. 5 illustrates spectral effects on x-ray mask contrast for a conventional x-ray exposure spectrum and for two x-ray exposure spectrums in accordance with other embodiments of the present invention.

One of the benefits of utilizing a x-ray lithography system having an actinic filter is that it allows the user of the system to use thinner mask absorber films. The mask absorber films are made of elements having a high atomic weight, or of composites of these elements. Patterns corresponding to a specific circuit pattern are delineated in the absorber film to form transparent opening within the absorber film. X-rays pass through these transparent openings, while they are absorbed where the full thickness of the absorber film remains on the mask. For practical x-ray masks, the thickness of the absorber film is too thin for complete absorption of incident x-rays. Some fraction of the x-ray flux is transmitted through the absorber film. The quality of the lithographic image is affected by the relative amount of the light that passes through the absorber film. A figure of merit to describe the ratio of the light intensity under the opening in the absorber relative to the light intensity under the absorber film is called the mask contrast. The aspect ratio (i.e., the ratio of the width to the height) of x-ray mask absorbers typically increases with decreasing feature size for fixed contrast x-ray masks, and therefore fabrication of these masks becomes more difficult and as a result the quality of the x-ray mask is degraded. FIG. 5 shows the effect of different spectral distributions or photon energy distributions on mask contrast. More specifically, FIG. 5 shows a first spectrum, which is formed using a 1.5 micron thick aluminum actinic filter in conjunction with a 5 micron thick magnesium actinic filter, and a second spectrum, which is formed using a 4.5 micron thick aluminum actinic filter. In addition, a conventional spectrum is also shown. The first spectrum has the softest spectrum, meaning that its spectral distribution does not include some of the high energy photons present in the other spectra. In comparison, the conventional spectrum includes the complete distribution of low and high energy photons that typically range in photon energies from about 800 eV to about 2000 eV. FIG. 5 also shows that the first and second spectrums require a thinner mask absorber for any mask contrast value selected, as compared to the conventional spectrum. This is because a softer spectrum is composed of photons that are relatively less penetrating and therefore a thinner absorber film can be used to block the same relative amount of incident x-rays. Therefore, with these softer spectrums thinner absorber films may be used and the aspect ratio of the mask absorber can be held relatively fixed, and as a result x-ray mask with improved quality may be fabricated as the feature size of the mask decreases.

Figure 6:
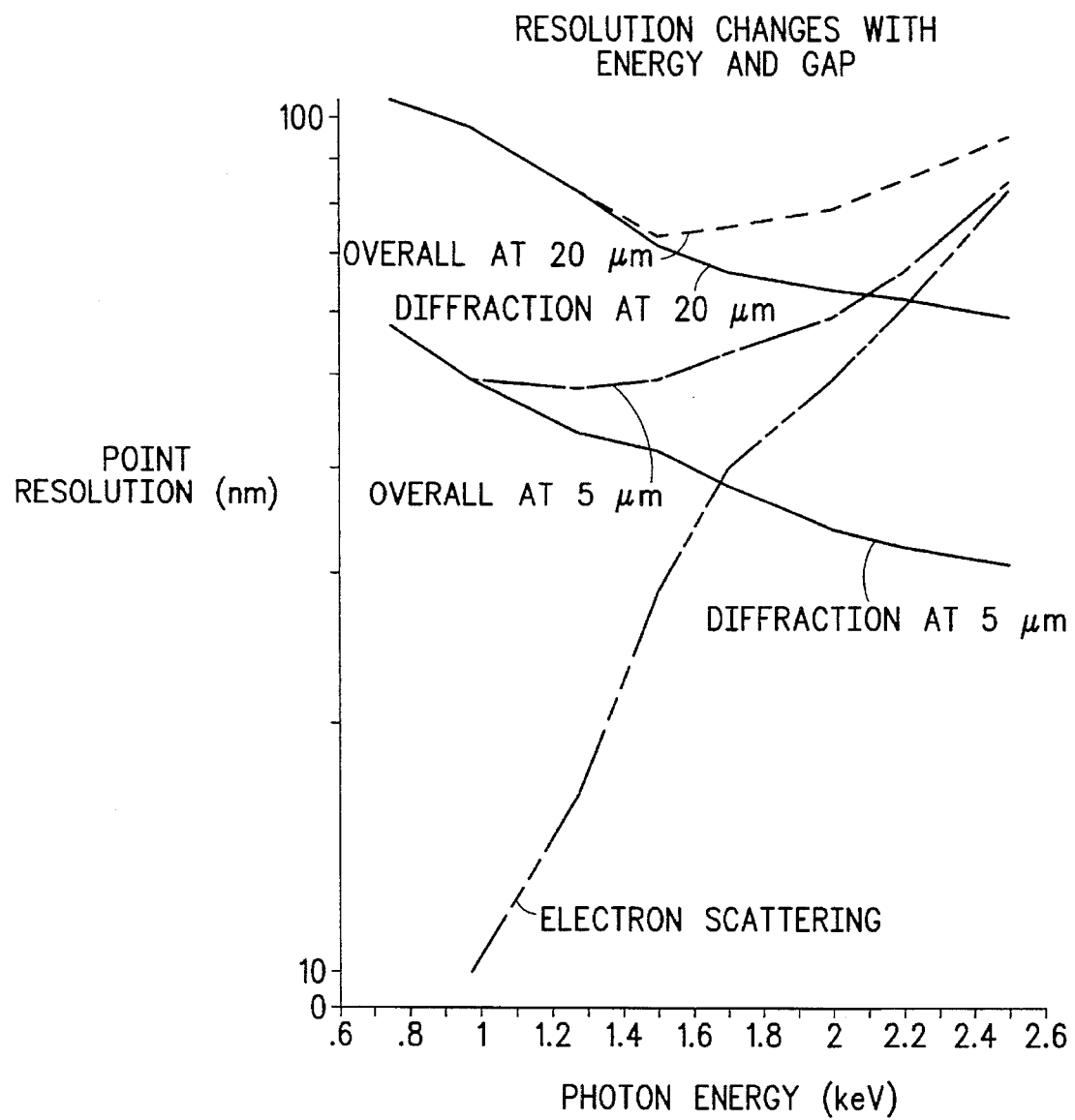
FIG. 6 illustrates point resolution as a function of photon energy and proximity gap.

Another benefit of using a x-ray lithography system having an actinic filter is improved lithographic performance. FIG. 6 shows a plot of the point resolution achievable as a function of photon energy. The overall resolution effect is composed of diffraction resolution effects, which are inherent to the lithography, and electron scattering resolution effects resulting from photoelectron, Auger, and secondary electrons. As integrated circuit feature sizes shrink the proximity gap between the mask and wafer may be reduced from about 20 microns to about 5 microns to maintain the quality of the lithographic image transfer from x-ray mask 22 to photoresist coated semiconductor substrate 24. FIG. 6 shows that for a proximity gap of 20 microns, and particularly for a proximity gap of 5 microns, there is a benefit to reducing or eliminating higher energy photons from the x-ray exposure spectrum. For example, FIG. 6 shows that if photons having an energy of greater than 2000 eV can be eliminated from the x-ray exposure spectrum then an overall resolution effect of less than 70 nm may be obtained.

Yet another benefit is that integrated circuits may be fabricated with reduced radiation damage. Since the x-ray exposure spectrum can be tailored for a distribution with photon energies lower than 1839 eV at the silicon absorption edge, the absorption of photons in integrated circuit films comprising silicon, such as silicon dioxide, polysilicon, and monocrystalline silicon may be reduced and thus trap formation in dielectric layers can be reduced.

Figure 7:
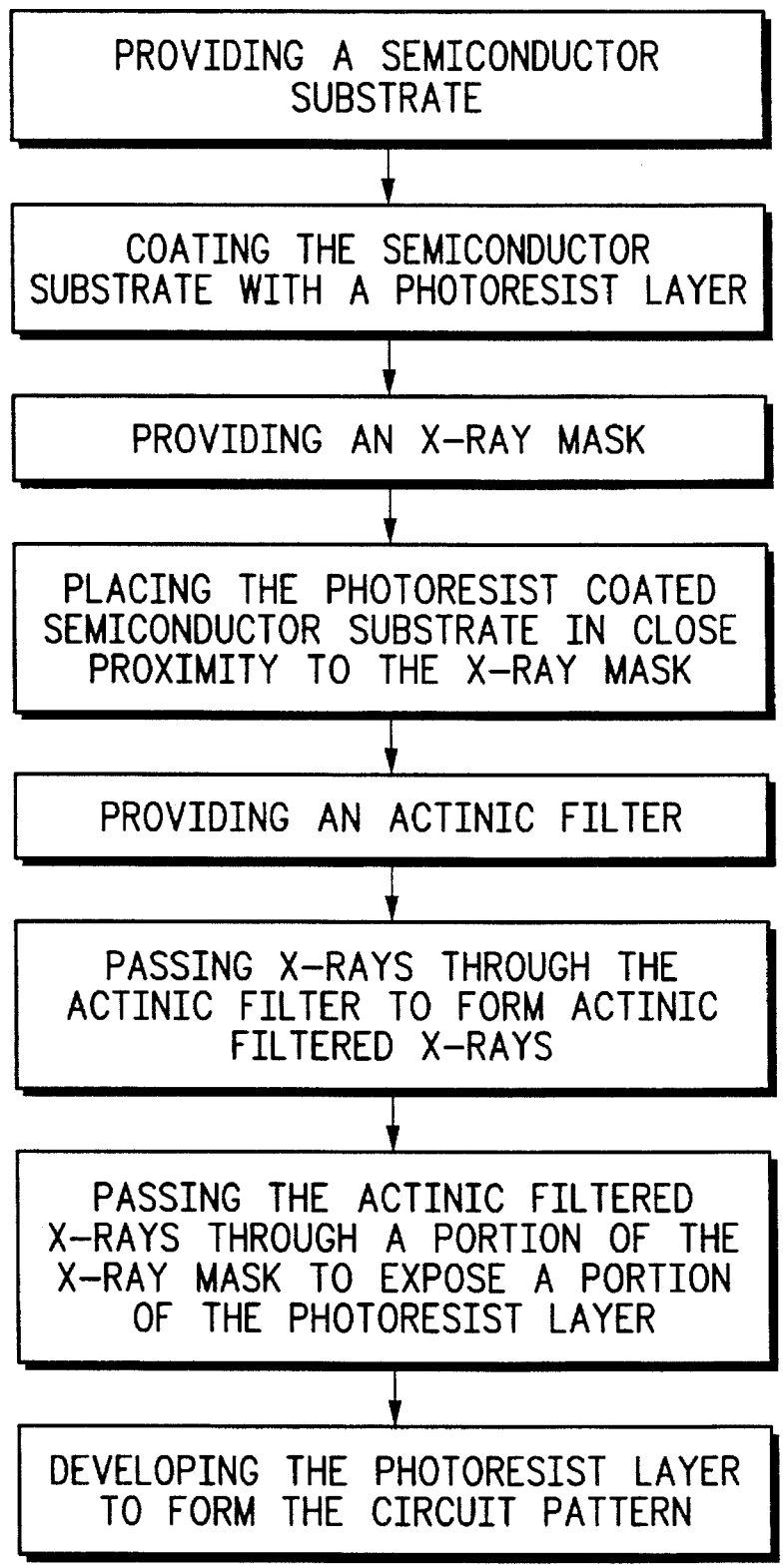
FIG. 7 illustrates a process flow diagram for the formation of a circuit pattern in accordance with one embodiment of the invention.

Shown in FIG. 7 is a process flow diagram for forming a circuit pattern with in accordance with one embodiment of the invention. A semiconductor substrate is obtained and then coated using conventional techniques with a x-ray photoresist, such as an acid amplifying resist or a diazonapthoquinone resist. In addition, it should be noted that the semiconductor substrate may have overlying devices or device layers such as polysilicon, oxide, metal, et cetera, as well as trench and diffusion regions, or the like. The photoresist coated semiconductor substrate 24 and a x-ray mask 22 are then placed in close proximity to one another, as shown in FIG. 1. X-rays are then passed through actinic filter 18 to form actinic filtered x-rays. At least a portion of the actinic filtered x-rays are then passed through a portion of x-ray mask 22 to expose a portion of the photoresist layer. The photoresist layer is then subsequently developed using conventional techniques to form a circuit pattern, which overlies the semiconductor substrate. The circuit pattern or photoresist mask can then be used either in conjunction with ion implantation to form implanted regions in the semiconductor substrate, or can be used in conjunction with conventional wet or dry etches to transfer the circuit pattern to the underlying semiconductor substrate.

The foregoing description and illustrations contained herein demonstrate many of the advantages associated with the present invention. It has been shown that filtering of a x-ray spectrum allows masks to be fabricated with thinner absorber films. Therefore, x-ray masks with improved quality may be fabricated with smaller feature sizes. Moreover, circuit patterns with improved resolution may be fabricated by filtering the x-ray spectrum. Yet another advantages is that the present invention allows integrated circuits to be fabricated with reduced radiation damage.

Thus it is apparent that there has been provided, in accordance with the invention, a method for forming a circuit pattern that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a plurality of actinic filters may be used modify or filter the x-ray spectrum. In addition, the invention is not limited to a specific x-ray source or to a specific proximity gap. It is also important to note that the present invention is not limited in any way to a particular type of x-ray mask or a particular type of photoresist. Furthermore, it is not intended that the invention be limited to the lithography system illustrated in FIG. 1. Therefore, it is intended that this invention encompass all such variations and modifications as fall within the scope of the appended claims.

I claim:

1. A method for forming a photoresist pattern on a semiconductor substrate comprising the steps of:

providing the semiconductor substrate;

coating the semiconductor substrate with a photoresist layer to form a photoresist coated semiconductor substrate;

providing an x-ray mask;

placing the photoresist coated semiconductor substrate in close proximity to the x-ray mask;

providing a first actinic filter comprising aluminum;

providing a second actinic filter comprising magnesium;

passing x-rays through the first actinic filter and the second actinic filter to form actinic filtered x-rays;

passing at least a portion of the actinic filtered x-rays through a portion of the x-ray mask to expose a portion of the photoresist layer; and developing the photoresist layer to form the photoresist pattern.

2. The method of claim 1, further comprising the steps of:

providing a window comprising beryllium, wherein the window is interposed between the x-ray mask and the first and second actinic filters.

3. (Amended) The method of claim 2, wherein the step of providing the first actinic filter is further characterized as providing an actinic filter consisting essentially of aluminum.

4. The method of claim 2, wherein the step of providing the second actinic filter is further characterized as providing an actinic filter consisting essentially of magnesium.

5. The method of claim 1, further comprising the steps of:

providing a window comprising beryllium, wherein the first and second actinic filters are interposed between the window and the x-ray mask.

6. The method of claim 5, wherein the step of providing the first actinic filter is further characterized as providing an actinic filter consisting essentially of aluminum.

7. The method of claim 5, wherein the step of providing the second actinic filter is further characterized as providing an actinic filter consisting essentially of magnesium.

8. The method of claim 1, wherein the step of providing the first actinic filter is further characterized as providing an actinic filter consisting essentially of aluminum.

9. The method of claim 1, wherein the step of providing the second actinic filter is further characterized as providing an actinic filter consisting essentially of magnesium.

10. A method for forming a photoresist pattern on a semiconductor substrate comprising the steps of:

providing the semiconductor substrate;

coating the semiconductor substrate with a photoresist layer to form a photoresist coated semiconductor substrate;

providing an x-ray mask;

placing the photoresist coated semiconductor substrate in close proximity to the x-ray mask;

providing an actinic filter comprising magnesium;

passing x-rays through the actinic filter to form actinic filtered x-rays;

passing at least a portion of the actinic filtered x-rays through a portion of the x-ray mask to expose a portion of the photoresist layer; and developing the photoresist layer to form the photoresist pattern.

11. The method of claim 10, further comprising the steps of:

providing a window comprising beryllium, wherein the window is interposed between the actinic filter and the x-ray mask.

12. The method of claim 11, wherein the step of providing the actinic filter is further characterized as providing an actinic filter consisting essentially of magnesium.

13. The method of claim 10, further comprising the steps of:

providing a window comprising beryllium, wherein the actinic filter is interposed between the window and the x-ray mask.

14. The method of claim 13, wherein the step of providing the actinic filter is further characterized as providing an actinic filter consisting essentially of magnesium.

15. The method of claim 10, wherein the step of providing the actinic filter is further characterized as providing an actinic filter consisting essentially of magnesium.

* * * * *